United States Patent
Matsubara et al.

[11] Patent Number: 6,163,217
[45] Date of Patent: Dec. 19, 2000

[54] OPERATIONAL AMPLIFIER

[75] Inventors: Kunihiro Matsubara, Kasugai; Hidenobu Ito, Aichi; Shinichi Nakagawa, Toki, all of Japan

[73] Assignee: Fujitsu Limited, Kawasaki, Japan

[21] Appl. No.: 09/292,935

[22] Filed: Apr. 16, 1999

[30] Foreign Application Priority Data

Nov. 12, 1998 [JP] Japan .................................. 10-321807

[51] Int. Cl.[7] ...................................................... H03F 3/45
[52] U.S. Cl. ............................................. 330/255; 330/260
[58] Field of Search .................................... 330/255, 260, 330/292

[56] References Cited

U.S. PATENT DOCUMENTS

| | | | |
|---|---|---|---|
| 4,015,212 | 3/1977 | Miyata | 330/13 |
| 5,210,506 | 5/1993 | Koch et al. | 330/255 |
| 5,289,058 | 2/1994 | Okamoto | 307/490 |
| 5,990,742 | 11/1999 | Suzuki | 330/253 |
| 5,999,054 | 12/1999 | Suzuki | 330/255 |
| 6,018,267 | 6/2000 | Tran et al. | 330/253 |

OTHER PUBLICATIONS

Patent Abstract of Japan S62–51305, Mar. 6, 1987.
Patent Abstract of Japan S63–133708, Jun. 6, 1988.

*Primary Examiner*—Robert Pascal
*Assistant Examiner*—Henry Choe
*Attorney, Agent, or Firm*—Arent Fox Kintner Plotkin & Kahn, PLLC

[57] ABSTRACT

A current charged into or discharged from a phase-compensating capacitor C1 in an output circuit is controlled by a level shift circuit so that the current is kept constant for input signals inputted to the input terminals IN+ and IN− of a differential amplifier circuit, and also a current charged into or discharged from a phase-compensating capacitor C2 is controlled by the current correcting circuit so that the current become equal to a constant current controlled by the level shift circuit, namely to a current charged into or discharged from the phase-compensating capacitor C1. Therefore, even if a quickly rising or falling signal is inputted into the differential amplifier circuit, the MOS transistor MP11 or MN11 is not set in an offset state, which prevents generation of an overshoot or an undershot in the output terminal.

5 Claims, 6 Drawing Sheets

OPERATIONAL AMPLIFIER

FIELD OF THE INVENTION

The present invention relates to an operational amplifier used in an MOS integrated circuit, and more specifically to an operational amplifier which prevents a generation of an overshoot or an undershoot.

BACKGROUND OF THE INVENTION

FIG. 1 is an explanatory view showing circuit configuration of a conventional operational amplifier. In FIG. 1, the conventional operational amplifier 100 comprises a differential amplifier circuit 101, a level shift circuit 102, and an output circuit 103, and an output terminal OUT forms a feedback loop by being connected to one of the input terminals IN– of the differential amplifier circuit 101.

The differential amplifier circuit 101 comprises a P-channel type of MOS transistor MP101 for supplying a constant current to a differential transistor pair described below in response to input of a bias voltage VB, P-channel type of MOS transistors MP102 and MP103 forming a differential transistor pair, and N-channel type of MOS transistors MN101 and MN102 forming a current mirror circuit which functions as an active load to an amplifier.

In the differential amplifier circuit 101, the source of the MOS transistor MP101 is connected to a power line which supplies a power-supply voltage VDD (high level voltage), and the gate is connected to a terminal which supplies a bias voltage VB. The sources of MOS transistors MP102 and MP103 are connected to each other and form a differential transistor pair. Further, the sources of the MOS transistors MP102 and MP103 are connected to the drain of the MOS transistor MP101, therefore, a current supplied via the MOS transistor MP101 is supplied to the differential transistor pair consisting of the MOS transistors MP102 and MP103 as described above.

Gate of the MOS transistor MP102 is connected to one of the input terminals (inverting circuit) IN– of the differential amplifier circuit 101, however, the input terminal IN– is connected to the output terminal OUT of the operational amplifier 100 to form a feedback loop for stabilizing a gain. Gate of the MOS transistor MP103 is connected to the other input terminal IN+ (non-inverting terminal) of the differential amplifier circuit 101, and an input signal from a signal source 110 is inputted thereto.

The gates of the MOS transistors MN101 and MN102 are connected to each other while the gate and the drain of the MOS transistor MN101 are connected to each other to form a current mirror circuit. Further, the sources of the MOS transistors MN101 and MN102 are connected to a line for a ground voltage VSS (a low level voltage).

A signal from the signal source is amplified by this differential amplifier circuit 101 and is outputted from the drain of the MOS transistor MP103. Output of the differential amplifier circuit 101, namely a signal from the drain of the MOS transistor MP103 is inputted into the level shift circuit 102 and output circuit 103 in the next stage.

The output circuit 103 comprises a P-channel type of MOS transistor MP104, a N-channel type of MOS transistor MN103, and phase-compensating capacitors C1 and C2 for preventing oscillation in the MOS transistors MP103 and MN104 respectively. The drains of the MOS transistors MP103 and MN104 are connected to each other, and a node of them is connected to the output terminal OUT.

The source of the MOS transistor MP104 is connected to the line for a power-supply voltage VDD, and output from the level shift circuit 102 is inputted into the gate of the MOS transistor MP104. Thus, the MOS transistor MP103 is driven by the level shift circuit 102. On the other hand, the source of the MOS transistor MN103 is connected to the line for a ground voltage VSS with output from the differential amplifier circuit 101 inputted into the gate of the MOS transistor MN103. Thus, the MOS transistor MN103 is directly driven according to the output from the differential amplifier circuit 101.

The phase-compensating capacitor C1 is connected between the gate and the drain of the MOS transistor MP104, while the phase-compensating capacitor C2 is connected between the gate and the drain of the MOS transistor MN103. Further, a load capacitance Co is connected between the output terminal OUT and the ground voltage VSS.

FIG. 2 is an explanatory view showing a detailed circuit configuration of an operational amplifier based on the conventional technology. In order to make the description of operations clear, it is assumed herein that an operational amplifier 200 shown in FIG. 2 has a circuit configuration in which in the operational amplifier 100 shown in FIG. 1 the bias circuit 104 for driving the differential amplifier circuit 101 is added, and that the level shift circuit 102 has a circuit configuration as shown in FIG. 1. It should be noted that, the same reference numerals are assigned to components common to those shown in FIG. 1 and description thereof is omitted herein.

The bias circuit 104 comprises a constant power supply source 111, a P-channel type of MOS transistor MP105, and N-channel type of MOS transistors MN104 and MN105 forming a current mirror circuit. In the bias circuit 104, the source of the MOS transistor MP105 is connected to the line for the power-supply voltage VDD and the gate and the drain are connected to each other.

Gate of the MOS transistor MP105 is connected to the gate of the MOS transistor MP101 of the differential amplifier circuit 101, and the MOS transistors MP105 and MP101 form a current mirror circuit. With this current mirror circuit, the MOS transistor MP101 can supply a stable current to the differential transistor pair. Namely, the MOS transistor MP105 supplies the bias voltage VB shown in FIG. 1.

Gate of the MOS transistor MN104 is connected to the gate of the MOS transistor MN107 of the level shift circuit 102, and the MOS transistors MO104 and MN107 form a current mirror circuit. With this current mirror circuit, a constant current can be supplied to the MOS transistor MO107.

The level shift circuit 102 comprises P-channel type of MOS transistors MP106 and MP107 forming a current mirror circuit, a P-channel type of MOS transistor MP108, and N-channel type of MOS transistors MN106 and MN107.

In the level shift circuit 102, the gates of the MOS transistors MP106 and MP107 are connected to each other and the gate and the drain of the MOS transistor MP106 are connected to each other to form a current mirror circuit. Further, the sources of the MOS transistors MP106 and MP107 are connected to the line for the power-supply voltage VDD.

The source of the MOS transistor MP108 is connected to the line for the power-supply voltage VDD and also the gate and the drain are connected to each other. Gate of the MOS transistor MP108 is connected to the gate of the MOS transistor MO104 of the output circuit 103, and forms a current mirror circuit with the pair of the MOS transistors MP108 and MP104.

The drain of the MOS transistor MN106 is connected to the drain of the MOS transistor MP106, and the source is connected to the line for the ground voltage VSS. Gate of the MOS transistor MN106 is connected to an output terminal of the differential amplifier circuit 101, namely to the drain of the MOS transistor MP103.

The drain of the MOS transistor MN107 is connected to the drain of the MOS transistor MP108, and the source is connected to the line for the ground voltage VSS. Gate of the MOS transistor MN107 is connected to the gate of the MOS transistor MN104 to form a current mirror circuit comprising the MOS transistor MN104 in the bias circuit 104 and MOS transistor MN107.

Next, description is made for operation of an operational amplifier 200 shown in FIG. 2 centering on a current flow therein. At first, a case is considered in which a first-transitional signal is inputted from the signal source 110 to charge the load capacitance Co, namely for a transitional state where a relation between a voltage outputted from the output terminal OUT (described above VOUT hereinafter) and a voltage inputted into the input terminal IN+ (described as VIN hereinafter) is VIN>VOUT. In this case, a potential at the drain of the MOS transistor MP103 is substantially at a level of the ground voltage VSS (0 V), and the MOS transistors MN106 and MN103 are cut off.

Then a potential at the drain of the MOS transistor 106 becomes close to a level of the power-supply voltage VDD, and a drain current Ip106 flowing through the MOS transistor MP106 becomes substantially zero. Because the MOS transistors MP106 and MP107 form a current mirror circuit, a drain current Ip107 flowing through the MOS transistor MP107 is supplied according to the expression Ip107={(Wp107/Lp107)/(Wp106/Lp106)}·Ip106 in proportion to the ratio of transistor sizes of the MOS transistors MP106 and MP107.

Herein Wp106 and Wp107 indicate a width of the channel of the MOS transistors MP106 and MP107 respectively, while Lp106 and Lp107 indicate a length of the channel of the MOS transistors MP106 and MP107 respectively. Herein, however, as the drain current Ip106 is nearly zero as described above, the drain current Ip107 is also almost zero.

A drain current In107 flowing through the drain of the MOS transistor MN107 is a constant current equal to a current flowing in the MOS transistor MN104, namely it is equal to a current I0 supplied from a constant current source 111 because of the fact that the MOS transistors MN107 and MN104 form a current mirror circuit. It is assumed herein, however, that the transistor size of the MOS transistor MN104 is the same as the transistor size of the MOS transistor MN107.

Although the drain current In107 is expressed as a sum of the drain current Ip107 flowing in the MOS transistor MP107 and the drain current Ip108 flowing in the MOS transistor MP108 as described above, because the drain current Ip107 is substantially zero the In107 is equal to Ip108 and the drain current Ip108 flows as the substantially drain current In107, namely as a current substantially equal to the constant current I0, to the MOS transistor MN107.

Further, because the MOS transistors MP108 and MP104 form a current mirror circuit, the drain current Ip104 flowing through the MOS transistor MP104 is obtained according to the expression Ip104={(Wp104/Lp104)/(Wp108/Lp108)}·Ip108, in proportion to the ratio of the transistor sizes of the MOS transistors MP108 and MP104.

Herein, Wp104 and Wp108 indicate a wide of the channel of the MOS transistors MP104 and MP108 respectively, while Lp104 and Lp108 indicate a length of the channel of the MOS transistors MP104 and MP108 respectively. Herein, assuming that {(Wp104/Lp104)/(Wp108/Lp108)}=n, transistor sizes of the MOS transistors MP104 and MP108 are set such that the drain current Ip104 is n times larger than the drain current Ip108. It is also assumed that, the transistor size of the MOS transistor MN103 is the same as the transistor size of the MOS transistor MP104.

Herein, because the drain current In103 in the MOS transistor MN103 is substantially zero due to input of a low-level voltage into the gate of the MOS transistor MN103 as described above, a current substantially equal to the drain current Ip104 flows through the output terminal OUT (described as IOUT hereinafter). Namely, the relational expression IOUT=Ip104=n·Ip108=n·Ip107=n·I0 holds, and charging to the load capacitance Co is achieved with this current IOUT.

Next, a case is considered in which a last-transitional signal is inputted from the signal source 110 and the load capacitance C0 is discharged, namely for a state where the relation between the output voltage VOUT and input voltage VIN is VIN<VOUT. In this case, as a low-level input voltage VIN close to the ground voltage VSS is inputted into the gate of the MOS transistor MP103,a potential at the drain of the MOS transistor MN102 becomes higher than a threshold value for the MOS transistors MN103 and MN106 and the drain current In106 in the MOS transistor MN106 and the drain current In103 in the MOS transistor 103 increase.

The drain current Ip106 in the MOS transistor MP106 flows with an amplitude substantially equal to that of the drain current In106, and also the drain current Ip107 in the MOS transistor MP107 has an amplitude equal to that of the drain current Ip106 because of configuration of a current mirror circuit.

Herein, the drain current In107 in the MOS transistor MN107 can be expressed as a sum of the drain currents Ip107 and Ip108, but the drain current In107 is a constant current I0 because of the current mirror configuration consisting of the MOS transistors MN104 and MN107, so that the drain current Ip107 increases in association with increase of the drain current In106 (=drain current Ip106) while the drain current Ip108 decreases.

Decrease of the drain current Ip108 in the MOS transistor MP108 means decrease of the drain current Ip104 in the MOS transistor MP104 because of the current mirror circuit configuration. Thus, a sufficiently decreased drain current Ip104 flows through the MOS transistor MP104 as an idling current, and a current with an amplitude obtained by subtracting the drain current Ip104 from the drain current In103 flowing in the MOS transistor MN103 (In103–Ip104) is discharged as a suction current from the output terminal OUT from the load capacitance Co.

Next, a case is considered in which charging into or discharging from the load capacitance Co is not executed, namely for a state where the relation between the output VOUT and input voltage VIN is VIN=VOUT. In this case, a current is not inputted into or nor outputted from the output terminal OUT, and the relation between a drain current in the MOS transistor MP104 and that in the MOS transistor MN103 is Ip104=In103. Only in this stabilized state, a voltage inputted from the signal source 110 into the differential amplifier circuit 101 is amplified by one time, and is accurately outputted from the output terminal OUT.

Thus, in the operational amplifier 200 described above, the output is connected to the input terminal to form a feedback loop, and this circuit realizes signal amplification with a stable gain in both the transitional state such as VIN<VOUT or VIN>VOUT and also in the stable state of VIN=VOUT.

Herein, in the confessional type of operational amplifier like the operational amplifier 200 shown in FIG. 2, to prevent generation of troubles such as oscillation of an input signal having a high frequency or vibration to a transitional response of an input signal, generally phase-compensating capacitors C1 and C2 are provided in the output circuit.

However, in the operational amplifier 200 shown in FIG. 2, output from the level shift circuit 102 is inputted into the gate of the MOS transistor MP104 with the phase-compensating capacitor C1 provided therein, while output from the differential amplifier circuit 101 is directly inputted, not via the level shift circuit 102, into the gate of the MOS transistor MP103 with the phase-compensating capacitor C2 provided therein.

Therefore, a difference is generated between a current charged into or discharging from the phase-compensating capacitors C1 and C2, hence a cut-off state is generated in the MOS transistor MN103 or MP104, which in turn generates an overshoot or an undershoot.

FIG. 3 is an explanatory view showing a detailed circuit configuration for explaining generation of overshoot in an operational amplifier based on the conventional technology. FIG. 4 is a timing chart showing operations when overshoot is generated in the conventional type of operational amplifier. FIG. 3 shows a flow of a discharged current from the phase-compensating capacitors C1 and C2 when a signal indicating a rapid first transition is inputted especially to the input terminal IN+.

In FIG. 3, at first, when an input signal with a quick first-transitional speed is inputted into the gate of the MOS transistor MP103, namely the step input SP as shown in FIG. 4 is loaded thereto, because of the difference between the timing of the first transition of output, only the MOS transistor MP103 is cut off for a certain period of time with the MOS transistor MP102 kept ON.

In the bias circuit 104, as described above, with a current mirror circuit consisting of the MOS transistors MN104 and MN105 as well as with the MOS transistor MP105, a constant current I0 supplied from a current source 111 flows as a drain current to the MOS transistor MP101 in the differential amplifier circuit 101. This constant current I0 is supplied to a differential transistor pair consisting of the MOS transistors MP102 and MP103, but as the MOS transistor MP103 is OFF, the constant current I0 flows via the MOS transistor MP102 which is in an ON state to the MOS transistor MN101.

When the constant current I0 flows into the MOS transistor MN101, it is necessary that the constant current I0 also flows as a drain current into the MOS transistor MN102 due to an action of the current mirror circuit. Herein, as the MOS transistor MP103 is in the cut-off state, the drain current equivalent to constant current I0 for the MOS transistor MN102 is extracted from the phase-compensating capacitor C2 of the output circuit 103 which is connected to the drain of the MOS transistor MN102. Namely, because of the charge, the phase-compensating capacitor C2 is driven by the constant current I0.

On the other hand, as the MOS transistor MN104 in the bias circuit 104 and the MOS transistor MN107 in the level shift circuit 102 form a current mirror circuit, it is required that, the constant current I0 flows as a drain current in the MOS transistor MN107 also. A drain current from the MOS transistor MN107 is expressed as a sum of the drain current Ip108 in the MOS transistor MP108 and a current extracted from the phase-compensating capacitor C1. Namely, because of the chagre, the phase-compensating capacitor C1 is driven by the constant current I1=(I0-Ip108).

Herein, assuming that the capacitance of the phase-compensating capacitor C1 is equal to that of the phase-compensating capacitor C2, in a case of I0>I1 as shown in FIG. 4, in a quick first transition of an input signal, a period HZ for which the MOS transistor MN103 is kept OFF is generated and an overshot OS is generated until the MOS transistor MN103 is again turned ON.

On the other hand, assuming that the capacitance of the phase-compensating capacitor C1 is equal to that of the phase-compensating capacitor C2, in a case of I0<I1, in a quick last transition of an input signal, a period for which the MOS transistor MP104 is cut OFF is generated and an undershoot is generated until the MOS transistor MP104 is again turned ON.

When a value of overshoot or undershoot, namely a component of the minimum output error voltage off from the specified output voltage becomes large, a time required until the output voltage is stabilized to the specified level becomes too long, which makes it impossible to quickly obtain stabilized amplified output.

This problem that a difference between a driving current for the phase-compensating capacitor C1 and that for the phase-compensating capacitor C2, namely a difference in a particular time constant can be solved by equalizing the driving capacity I1 of the level shift circuit 102 to the driving capacity I0 of the differential transistor pair, and this method is not effective when a capacity value of the load capacitance Co is large.

Namely, generally as a time constant for the load capacitance Co is set equal to a time constant for the phase-compensating capacitor C1, a relation C1·VOUT/(I0–Ip108)=Co+VOUT/n·Ip108 holds, and the current Ip108 is expressed by the expression Ip108=Co·I0/(Co+C1·n). Therefore, when Co becomes larger the current Ip108 becomes unignorable, and the relation I0>I1 is established, so that a difference between a time constant for the phase-compensating capacitor C1 and that for the phase-compensating capacitor C2 is generated.

SUMMARY OF THE INVENTION

The present invention was made to solve the problems described above, and it is an object of the present invention to provide an operational amplifier which can prevent a generation of an- overshot or an undershoot in the output and can obtain a stable amplified output.

In the present invention, a current control unit controls a current for a first output signal outputted from the differential amplifier, and the current correcting unit corrects a current for a second output signal outputted from the differential amplifier so that the value of the current is equal to the value of the current for the first output signal controlled by the current control unit. Therefore, generation of an overshoot or an undershoot in the output can be prevented.

According to one feature of the present invention, in the output circuit, the first MOS transistor deciding an output voltage level of the operational amplifier is controlled by using the level shift circuit, the second MOS transistor complementarily acting for the first MOS transistor is controlled by using the current correcting circuit, and at the same time the current correcting circuit corrects a current for driving the second phase-compensating capacitor so that a current charged into or discharged from the second phase-compensating capacitor connected to the second MOS transistor is equal to a current charged into or discharged from the first phase-compensating capacitor connected to the first MOS transistor. Thus, when the first and second phase-compensating capacitors are charged or discharged, no difference appears in the time required for charging or discharging the two capacitors and time constants for the two capacitors are equalized. Even in a transitional state where a step signal indicating quick first transition or last transition is inputted as an input signal, the state where only the first MOS transistor or second MOS transistor is offset never occurs, and generation of an overshot or an undershot due to the state where only the first or second MOS transistor is offset can be prevented.

According to one feature of the present invention, as an active load connected to a differential transistor pair constituting the differential amplifier circuit, a fifth MOS transistor and a sixth MOS transistor are connected in series to a third MOS transistor and a fourth MOS transistor forming differential transistor pair respectively. Thus, a constant current corresponding to an input signal inputted into the differential transistor pair can be given to an external MOS transistor forming a current mirror circuit together with the fifth or sixth MOS transistor, and also a stable drive with this stable constant current can be realized for an external circuit for the level shift circuit or for the current correcting circuit, which makes it possible to prevent a generation of an overshoot or an undershoot in the output from the operational amplifier without fail.

According to one feature of the present invention, the level shift circuit has a current mirror circuit, and a ninth MOS transistor and a tenth MOS transistor are serially connected to a seventh MOS transistor and an eighth MOS transistor forming this current mirror circuit respectively, and at the same time, the ninth MOS transistor forms a current mirror circuit together with the fifth MOS transistor as an active load for the differential amplifier circuit, and the tenth MOS transistor forms a current mirror circuit together with the sixth MOS transistor as an active load for the differential amplifier circuit. Thus, it is possible to control a voltage level at a node between the eighth and the tenth MOS transistor in response to a drain current flowing in the fifth MOS transistor and the sixth MOS transistor forming the differential transistor pair in the differential amplifier circuit. Namely, with the drain current flowing in the fifth MOS transistor and the sixth MOS transistor, not only the first MOS transistor connected to a node between the eighth MOS transistor and the tenth MOS transistor can be driven, but also a current charged into or discharged from the first phase-compensating capacitor can be stabilized.

According to one feature of the present invention, a current correcting circuit comprises three current mirror circuits, a fifteenth MOS transistor serially connected to the eleventh MOS transistor and a sixteenth MOS transistor serially connected to the thirteenth MOS transistor among the MOS transistors forming the current mirror circuits, and at the same time the fifteenth MOS transistor forms a current mirror circuit together with the fifth MOS transistor as an active load to the differential amplifier circuit, while the sixteenth MOS transistor forms a current mirror circuit together with the sixth MOS transistor as an active load to the differential amplifier circuit. Thus, it is possible to control a voltage level at a node between the twelfth and the eighteenth MOS transistor according to the drain current flowing in the fifth and the sixth MOS transistor forming a differential transistor In the bias circuit 16, the source of the MOS transistor MP12 is connected to the line for a power-supply voltage VDD and the gate and the drain are connected to each other.

Gate of the MOS transistor MP12 is connected to the gate of the MOS transistor MP13 in the differential amplifier circuit 15, and a current mirror circuit is formed by the MOS transistors MP12 and MP13. With this current mirror circuit, the MOS transistor MP13 can supply a stable current to the differential transistor pair described above.

The level shift circuit 12 comprises P-channel type of MOS transistors MP16 and MP17 forming a current mirror circuit, and N-channel type of MOS transistors MN16 and MN17.

In the level shift circuit 12, the gates of the MOS transistors MP16 and MP17 are connected to each other, and the drain and the gate of the MOS transistor MP16 are connected to each other to form a current mirror circuit. The sources of the MOS transistors MP16 and MP17 are connected to the line for the power-supply voltage VDD.

The drain of the MOS transistor MN16 is connected to the drain of the MOS transistor MP16 and the source is connected to the line for the ground voltage VSS. Gate of the MOS transistor MN16 is connected to the gate of the MOS transistor MN14 in the differential amplifier circuit 15.

With this configuration, the MOS transistors MN14 and MP16 form a current mirror circuit, and a drain current in pair in the differential amplifier circuit. Namely, not only the second MOS transistor connected to a node between the twelfth MOS transistor and the eighteenth MOS transistor can be driven but also a current charged into or discharged from the second phase-compensating capacitor can be maintained constant. Especially, this constantly charged or discharged current can be equalized to a charged or discharged current in the first phase-compensating capacitor similarly decided by the drain currents flowing in the fifth MOS transistor and the sixth transistor by making use of the current mirror circuit, which makes it possible to prevent generation of an overshoot or an undershoot in the output from the operational amplifier without fail.

Other objects and features of this invention will become apparent from the following description with reference to the accompanying drawings.

DESCRIPTION OF THE PREFERRED EMBODIMENTS

Figure 1:
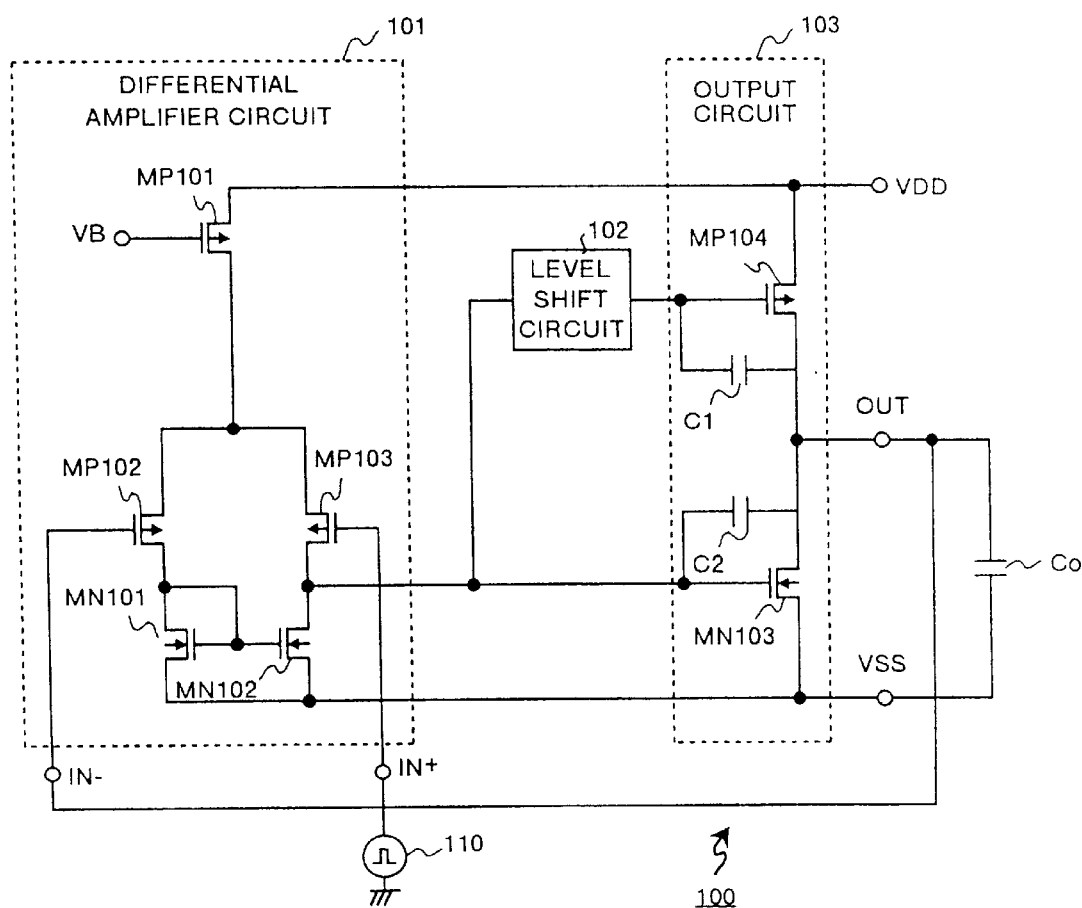
FIG. 1 is an explanatory view showing circuit configuration of a conventional operational amplifier.
Figure 2:
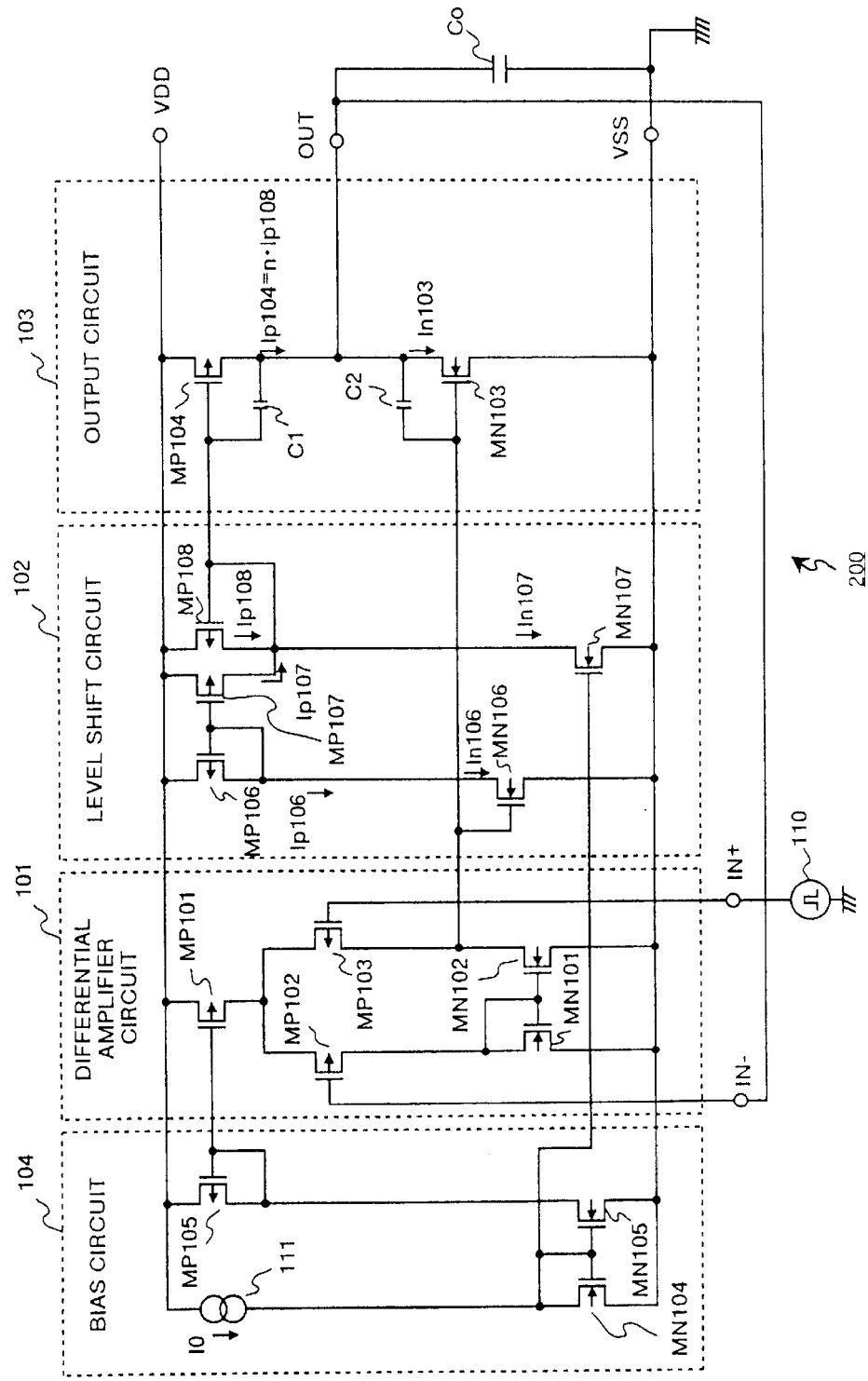
FIG. 2 is an explanatory view showing a detailed circuit configuration of the conventional operational amplifier.
Figure 3:
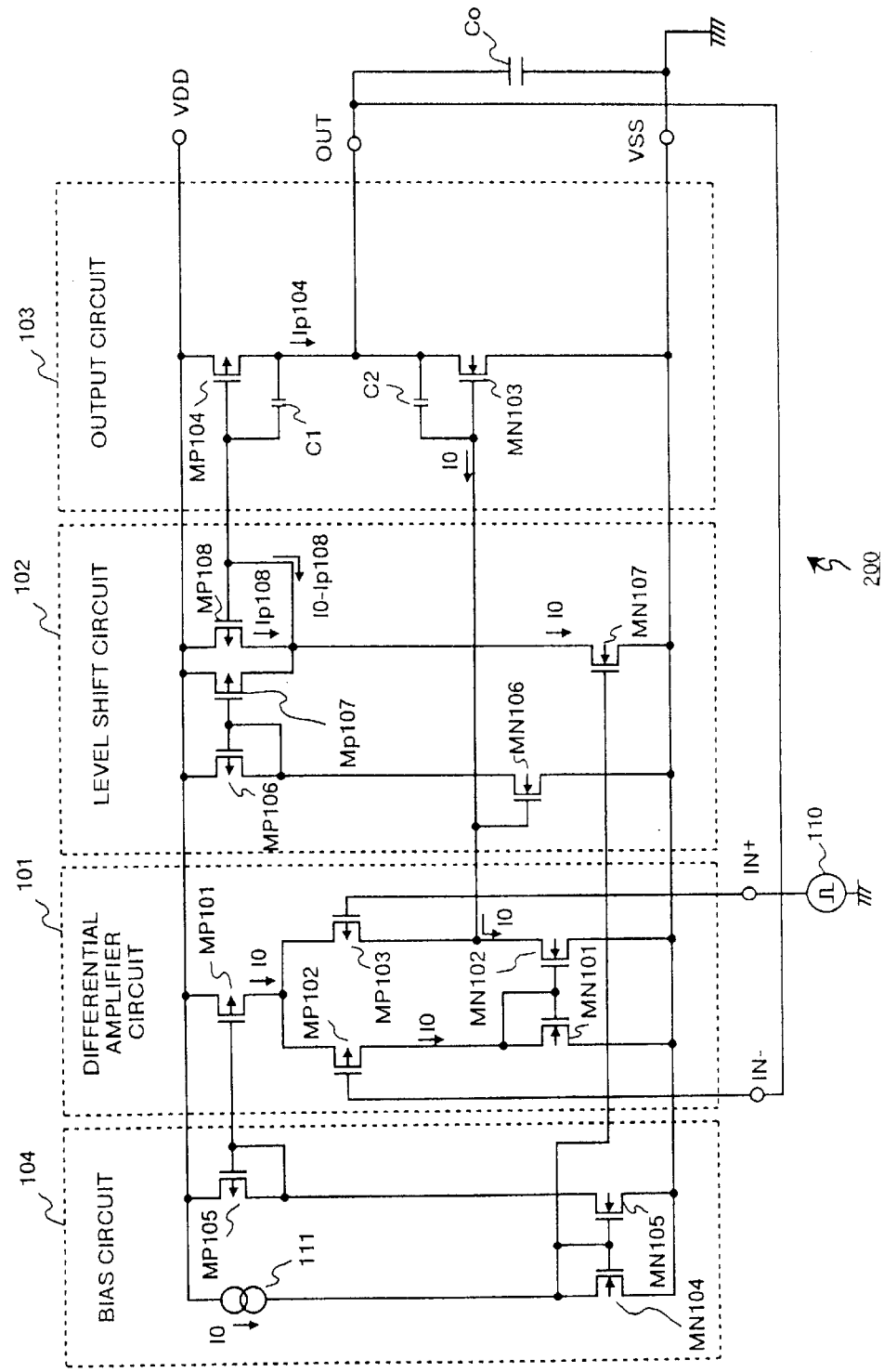
FIG. 3 is an explanatory view showing a detailed circuit configuration for explaining generation of overshot in the conventional operational amplifier.
Figure 4:
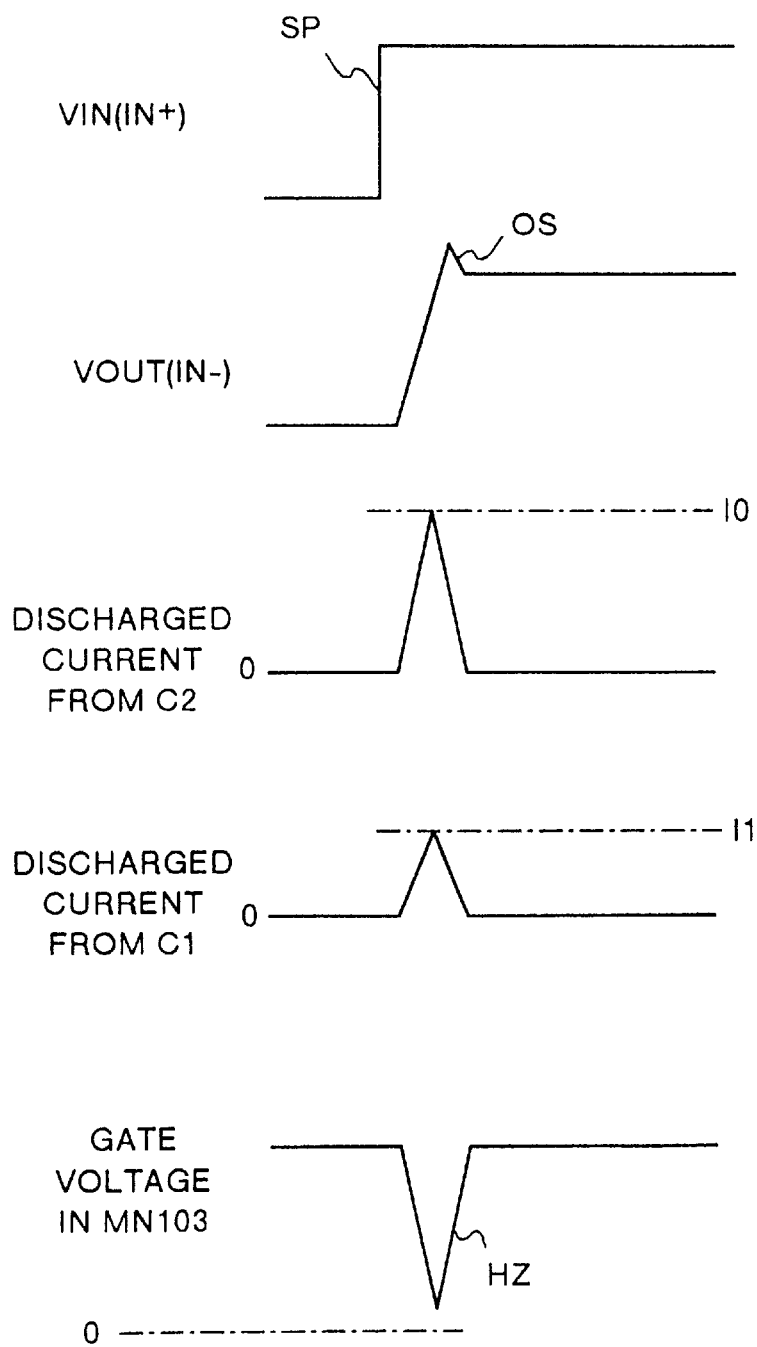
FIG. 4 is a timing chart showing operations of the conventional operational amplifier when an overshot is generated.
Figure 5:
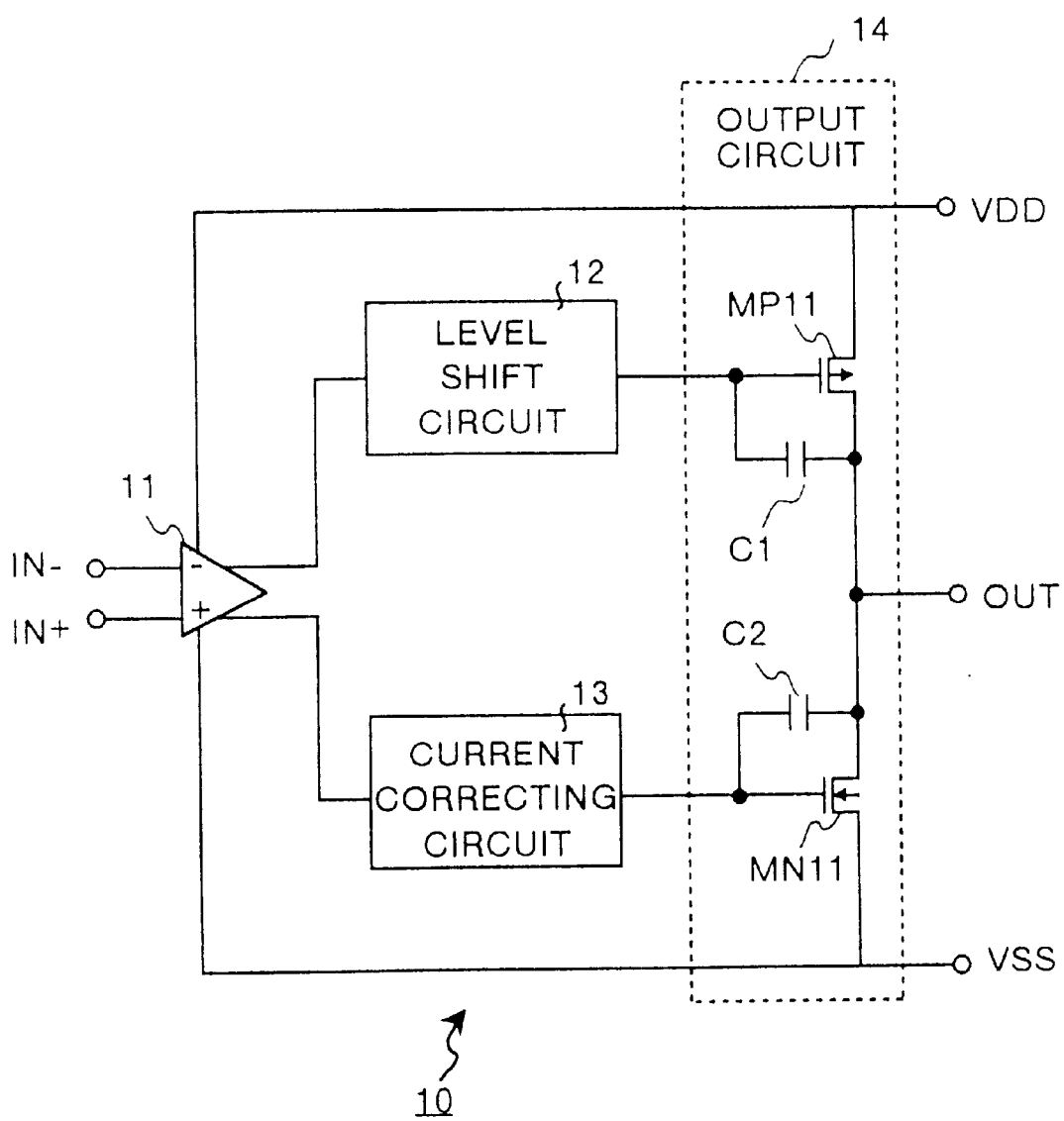
FIG. 5 is an explanatory view showing circuit configuration of an operational amplifier according to an embodiment of the present invention.

Detailed description is made for a preferred embodiment of the operational amplifier according to the present inven- FIG. 5 is an explanatory view showing circuit configuration of the operational amplifier according to the embodiment. In FIG. 5, an operational amplifier 10 according to this embodiment comprises a differential amplifier 11, a level shift circuit 12, a current correcting circuit 13, and an output circuit 14, and amplifies a difference between signals inputted to the two input terminals IN− (inverting terminal) and IN+ (non-inverting terminal) and outputs the amplified difference from the OUT terminal.

The output circuit 14 comprises a P-channel type of MOS transistor MP11, a N-channel type of MOS transistor MN11, and phase-compensating capacitors C1 and C2 for preventing oscillation in the MOS transistors MP11 and MN 11 respectively. The drains of the MOS transistors MP11 and MN11 are connected to each other, and form a complementary circuit with the node thereof connected to an output terminal OUT.

The source of the MOS transistor MP11 is connected to a line for a power-supply voltage VDD and output from the level shift circuit 12 is inputted into the gate thereof. Thus, the MOS transistor MP11 is driven by the level shift circuit 12. On the other hand, the source of the MOS transistor MN11 is connected to a line for a ground voltage VSS and output from the current correcting circuit 13 is inputted into the gate thereof. Thus, the MOS transistor MN11 is driven by the current correcting circuit 13.

The phase-compensating capacitor C1 is connected in between the gate and the drain of the MOS transistor MP11, while the phase-compensating capacitor C2 is connected in between the gate and the drain of the MOS transistor MN11. It is assumed herein that the capacitance of the phase-compensating capacitor C1 is equal to the capacitance of the phase-compensating capacitor C2 (i.e. C1=C2).

Figure 6:
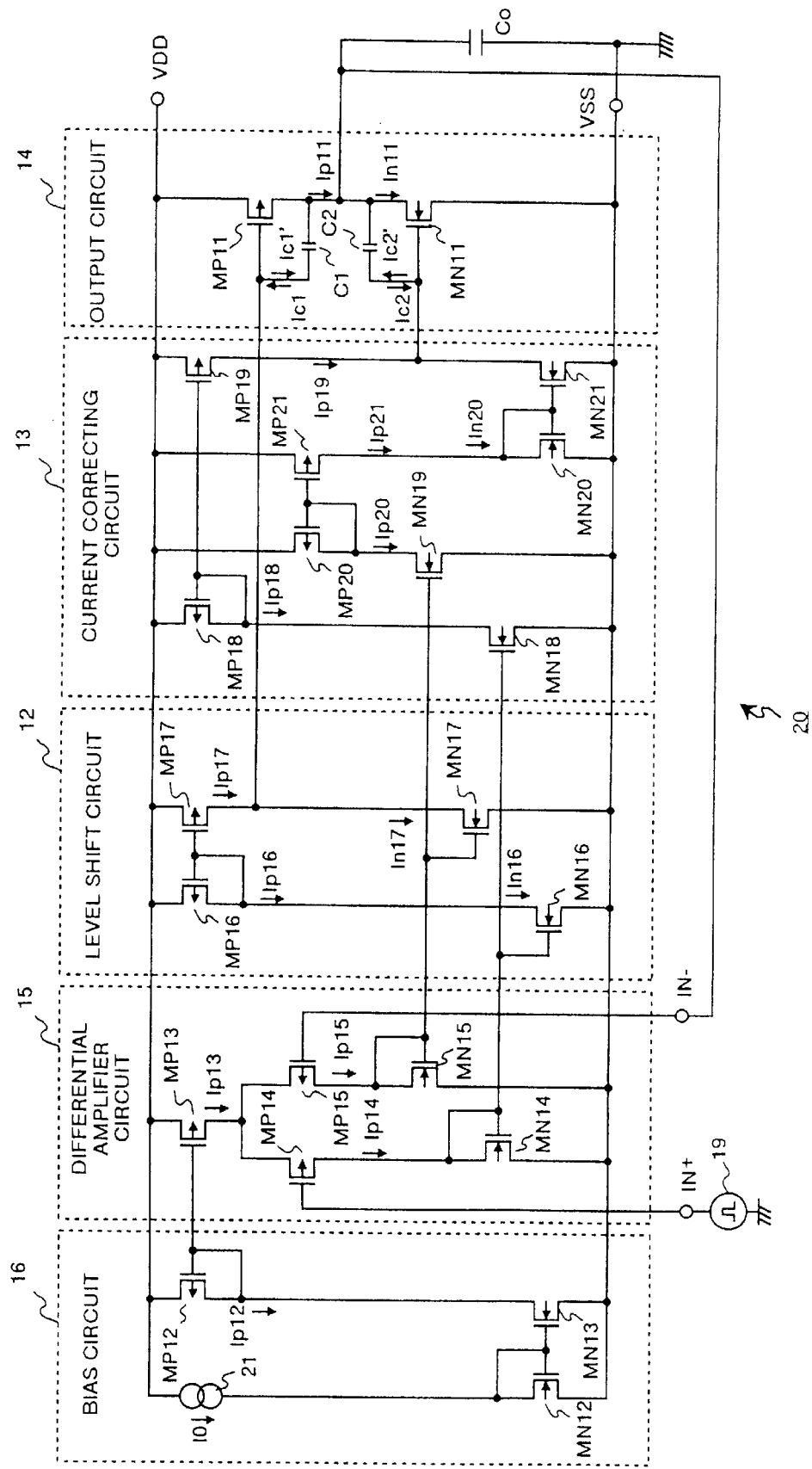
FIG. 6 is an explanatory view showing a detailed circuit configuration of the operational amplifier according to the present invention.

FIG. 6 is an explanatory view showing a detailed circuit configuration of the operational amplifier according to the embodiment. To clarify the following description, the operational amplifier 20 in FIG. 6 shows the circuit configuration comprising the differential amplifier 11, level shift circuit 12, and current correcting circuit 13 each in the operational amplifier 10 shown in FIG. 5 with a load capacitance Co added between the output terminal OUT and the line for the ground voltage VSS. The same reference numerals are assigned to components common to those in FIG. 5 and description thereof is omitted herein.

The operational amplifier 11 comprises a differential amplifier circuit 15 for outputting a difference between signals inputted into the input terminals IN+ and IN−, and a bias circuit 16 for loading a bias voltage to the differential amplifier circuit 15. The differential amplifier circuit 15 comprises a P-channel type of MOS transistor MP13 for supplying a constant current to a differential transistor pair described below according to a bias voltage outputted from the bias circuit 16, P-channel type of MOS transistors MP14 and MP15 forming a differential transistor pair, and N-channel type of MOS transistors MN14 and MN15 each functioning as an active load.

In the differential amplifier circuit 15, the source of the MOS transistor MP13 is connected to the power-supply line for supplying a power-supply voltage VDD (high level voltage) and the gate is connected to a terminal for supplying a bias voltage. The sources of the MOS transistors MP14 and MP15 are connected to each other to form a differential transistor pair. Further, the sources of the MOS transistors MP14 and MP15 are connected to the drain of the MOS transistor MP13, therefore, a current supplied via the MOS transistor MP13 is supplied to the differential transistor pair consisting of the MOS transistors MP14 and MP15.

Gate of the MOS transistor MP14 is connected to the input terminal IN+ of the differential amplifier circuit 15, and receives an input signal from a signal source 19. Gate of the MOS transistor MP15 is connected to the other input terminal IN− of the differential amplifier circuit 15, but this input terminal IN− is connected to the output terminal OUT of the operational amplifier 20 to form a feedback loop for stabilizing a gain.

The drain of the MOS transistor MN14 is connected to the drain of the MOS transistor MP14, and the source is connected to the line for the ground voltage VSS (low level voltage) with the gate and the drain connected to each other. The drain of the MOS transistor MN15 is connected to the drain of the MOS transistor MP15, and the source is connected to the line for the ground voltage VSS and the gate and the drain are connected to each other.

The bias circuit 16 comprises a constant current source 21, a P-channel type of MOS transistor MP12, and N-channel of MOS transistors MN12 and MN13 forming a current mirror circuit. proportion to a current flowing in the MOS transistor MN14 flows in the MOS transistor MP16. It is assumed herein that the transistor size of the MOS transistor MO16 is the same as the transistor size of the MOS transistor MN14 and drain currents each having the same amplitude flow in the two MOS transistors.

The drain of the MOS transistor MN17 is connected to the drain of the MOS transistor MP17 and the source is connected to the line for the ground voltage VSS. The gate of the MOS transistor MN17 is connected to the gate of the MOS transistor MN15 in the differential amplifier circuit 15. Thus, the MOS transistors MN15 and MP17 form a current mirror circuit, and a drain current in proportion to a current flowing in the MOS transistor MN15 flows to the MOS transistor MN17. It is assumed herein that, the transistor size of the MOS transistor MP17 and the transistor size of the MOS transistor MN15 are same, and drain currents each having the same amplitude flow in the two MOS transistors.

The current correcting circuit 13 comprises a P-channel type of MOS transistors MP18 and MP19 forming a current mirror circuit, P-channel type of MOS transistors MP20 and MP21 forming a current mirror circuit, and N-channel type of MOS transistors MN18, MN19, MP20 and MN21 forming a current mirror circuit.

In the current correcting circuit 13, the gates of the MOS transistors MP18 and MP19 are connected to each other, and the gate and the drain of the MOS transistor MP18 are connected to each other to form a current mirror circuit. The sources of the MOS transistors MP18 and MP19 are connected to the line for the power-supply voltage VDD.

The gates of the MOS transistors MP20 and MP21 are connected to each other, and the gate and the drain are connected to each other to form a current mirror circuit. Further, the sources of the MOS transistors MP20 and MP21 are connected to the line for the power-supply voltage VDD.

The drain of the MOS transistor MN18 is connected to the drain of the MOS transistor MP18 and the source is connected to the line for the ground voltage VSS. Gate of the MOS transistor MN18 is connected to the gate of the MOS transistor MN14 in the differential amplifier circuit 15. Thus, the MOS transistors MN14 and MP18 form a current mirror circuit, and a drain current proportional to a current flowing in the MOS transistor MN14 flows in the MOS transistor MP18. It is assumed that, the transistor size of the MOS transistor MP18 is the same as the transistor size of the MOS transistor MN14, and drain currents each having the same amplitude flow in the two MOS transistors.

The drain of the MOS transistor MN19 is connected to the drain of the MOS transistor MP20 and the source is connected to the line for the ground voltage VSS. Gate of the MOS transistor MN19 is connected to the gate of the MOS transistor MN15 in the differential amplifier circuit 15. Thus, the MOS transistors MN15 and MN19 form a current mirror circuit, and a drain current in proportion to a current flowing in the MOS transistor MN15 flows in the MOS transistor MP19. It is assumed that, the transistor size of the MOS transistor MP19 is the same as the transistor size of the MOS transistor MN15 and drain currents each having the same amplitude flow in the two MOS transistors.

The gates of the MOS transistors MN20 and MN21 are connected to each other, and the gate and the drain of the MOS transistor MN20 are connected to each other to form a current mirror circuit. Further, the sources of the MOS transistors MN20 and MN21 are connected to the line for the ground voltage VSS.

Gate of the MOS transistor MP11 in the output circuit 14 is connected to the drain of the MOS transistor MP17 in the level shift circuit 12. Therefore, the MOS transistor MP11 in the output circuit 14 is driven by the level shift circuit 12. Further, the gate of the MOS transistor MN11 in the output circuit 14 is connected to the drain of the MOS transistor MP19 in the current correcting circuit 13. Therefore, the MOS transistor MN11 in the output circuit 14 is driven by the current correcting circuit 13.

It is assumed herein that, in the MOS transistors each constituting the operational amplifier 20, transistor sizes the MOS transistors other than those of MOS transistors MP11 and MN11 are identical and also that a signal amplified by n times as compared to a signal inputted into the gate can be outputted to the MOS transistor MP11 as well as to the MOS transistor MN11.

Next, description is made for operations of the operational amplifier 20 in FIG. 6 centering on a flow of an electric current. At first, in the bias circuit 16, a constant current I0 flows as a drain current to the MOS transistor MN12 from the current source 21. The MOS transistors MN12 and MN13 form a current mirror circuit, so that the constant current I0 also flows as a drain current in the MOS transistor MN13, and also the constant current I0 flows as a drain current Ip12 in the MOS transistor MP12 serially connected to this MOS transistor MN13.

The MOS transistor MP13 in the differential amplifier circuit 15 forms a current mirror circuit together with the MOS transistor MP12, so that the constant current I0 flows therein as a drain current Ip13, and the drain current Ip13 (=constant current I0) is supplied to a differential transistor pair consisting of the MOS transistors MP14 and MP15.

A case is considered in which a step signal quickly rising, especially a high voltage level signal is inputted as an input signal from the signal source 19 to the terminal IN+. This is a state where a gate voltage in the MOS transistor MN11 in the output circuit goes down to charge the load capacitance Co, or a case where the relation between a voltage outputted from the output terminal OUT (described as VOUT hereinafter) and a voltage inputted into the input terminal IN+ (described as VIN hereinafter) is VIN>VOUT.

When the quickly rising step signal described above is inputted into the gate of the MOS transistor MP14, a drain current Ip14 in the MOS transistor MP14 becomes almost zero, and in association with this phenomenon, also a drain current substantially close to zero flows in the MOS transistor MN18 which forms a current mirror circuit together with the MOS transistor MP14.

Therefore, a drain current Ipl8 becomes almost zero also in the MOS transistor MP18 which is serially connected to the MOS transistor MN18, and also a drain current Ip19 becomes almost zero in the MOS transistor MP19 which forms a current mirror circuit together with this MOS transistor MP18.

On the other hand, the output voltage VOUT, namely a voltage inputted into the input terminal IN− can not follow the quick first transition of the input voltage VIN and is closed to the level of the ground voltage VSS, and also the drain current Ip14 in the MOS transistor MP14 becomes almost zero, so that a drain current Ip15 flowing in the MOS transistor MP15 is almost equal to the current Ip13 supplied from the MOS transistor MP13, namely to the constant current I0.

The drain current Ip15 becomes a drain current in the MOS transistor MN15, and the constant current I0 flows as a drain current also in the MOS transistor MN19 which forms a current mirror circuit together with the MOS transistor MN15. Because the MOS transistor MP20 is serially connected to the MOS transistor MN19, the constant current I0 flows as the drain current Ip20.

Also in the MOS transistor MP21 forming a current mirror circuit together with the MOS transistor MP20, the drain current Ip20 becomes of the same amplitude as that of the constant current I0. This constant current I0 becomes a drain current for the MOS transistor MN20 which is serially connected to the MOS transistor MP21. Because the MOS transistor MN21 forms a current mirror circuit together with the MOS transistor MN20, the constant current I0 flows as the drain current In21 also in the MOS transistor MN21.

Herein the MOS transistor MN21 is serially connected to the MOS transistor MP19, but as described above, the drain current in the MOS transistor MP19 shows almost zero, so that, to flow the constant current I0 as the drain current Ip21 in the MOS transistor MN21, it is necessary to extract an inlet current Ic2 from the phase-compensating capacitor C2 connected to the drain of the MOS transistor MN21. Namely, the phase-compensating capacitor C2 is driven by the inlet current Ic2 equal to the constant current I0.

As described above, because the drain current in the MOS transistor MN14 becomes almost zero the drain current In16 in the MOS transistor MN16 forming a current mirror circuit together with the MOS transistor MN14 also becomes almost zero. Because the MOS transistor MP16 is serially connected to the MOS transistor MN16, the drain current Ip16 also becomes zero, and the drain current Ip17 in the MOS transistor MP17 forming a current mirror circuit together with this MOS transistor MP16 also becomes zero.

As the MOS transistor MN17 forms a current mirror circuit together with the MOS transistor MN15, the drain current Ip15 from the MOS transistor MN15, namely the constant current I0 flows therein as the drain current In17.

Herein the MOS transistor MN17 is serially connected to the MOS transistor MP17, but as the drain current Ip17 in the MOS transistor MP17 becomes almost zero as described above, to flow the constant current I0 as the drain current Ip19 into the MOS transistor MN17 it is necessary to extract an inlet current Ic1 from the phase-compensating capacitor C1 connected to the drain of the MOS transistor MN17. Namely, the phase-compensating capacitor C1 is driven by the inlet current Ic1 equal to the constant current I0.

Thus, both the phase-compensating capacitors C1 and C2 are driven by the constant current I0, so that no difference occurs between a time constant for the phase-compensating capacitor C1 and that of the phase-compensating capacitor C2, and it is possible to prevent generation of the cut-off state of the MOS transistor MN11 due to completion of discharging in the phase-compensating capacitor C2 earlier as compared to the discharging in the phase-compensating capacitor C1. In other words, it is possible to prevent generation of an overshot in which an output voltage VOUT higher than an input voltage VIN is outputted according to the drain current Ip11 in the MOS transistor MP11 due to the cut-off state of the MOS transistor MN11.

Next, a case is considered in which a quickly falling step signal, especially a signal with a voltage level almost close to the ground voltage VSS is inputted. This is a state where a gate voltage in the MOS transistor MN11 in the output circuit 14 goes high and the load capacitance Co is discharged, or a case where the relation between the output voltage VOUT from the output terminal OUT and the input voltage VIN inputted to the input terminal IN+ is VIN<VOUT.

When a step signal having the last transition described above is inputted into the gate of the MOS transistor MP14, the output voltage VOUT, namely a voltage inputted into the input terminal IN− can not follow a quick last transition of the input voltage VIN, and is kept at a sufficiently high voltage level, and the drain current Ip15 flowing in the MOS transistor MP15 becomes almost zero. Therefore, a current substantially equal to the current Ip13 supplied from the MOS transistor MP13 flows in the MOS transistor MP14, namely a drain current Ip14 equal to the constant current I0.

The MOS transistor MN14 is serially connected to the MOS transistor MP14, so that the MOS transistor MN14 outputs the drain current Ip14 from the MOS transistor MP14, namely a drain current equal to the constant current I0. The MOS transistor MN18 forms a current mirror circuit together with this MOS transistor MN14 and hence the constant current I0 flows as a drain current in the MOS transistor MN18.

The MOS transistor MP18 is serially connected to the MOS transistor MN18, so that the constant current I0 flows as the drain current Ip18 in the MOS transistor MP18. The MOS transistor MP19 forms a current mirror circuit together with this MOS transistor MP18 so that a drain current Ip19 equal to the constant current I0 flows in it.

On the other hand, because the drain current Ip15 from the MOS transistor MP15 becomes almost zero a drain current from the MOS transistor MN15 serially connected to the MOS transistor MP15 also becomes almost zero. Therefore, a drain current from the MOS transistor MN19 forming a current mirror circuit with the MOS transistor MN15 becomes zero, and a drain current Ip20 from the MOS transistor MP20 serially connected to the MOS transistor MN19 becomes zero. Further, the drain current Ip21 in the MOS transistor MP21 forming a current mirror circuit together with the MOS transistor MP20 becomes almost zero.

Herein the MOS transistor MN21 is serially connected to the MOS transistor MP19, but it is necessary to flow the drain current Ip19 equal to the constant current I0 also in the MOS transistor MP19 as described above. This drain current Ip19 flows as a current Ic2' to the phase-compensating capacitor C2 connected to the drain of the MOS transistor MN21. Namely, the phase-compensating capacitor C2 is driven by the current Ic2' equal to the constant current I0.

Also as described above, the drain current from the MOS transistor MN14 is the same as the constant current I0 of the MOS transistor MN14, so that also the drain current In16 of the MOS transistor MN16 forming a current mirror circuit together with the MOS transistor MN14 is the same as the constant current I0. Because the MOS transistor MP16 is serially connected to the MOS transistor MN16, also the drain current Ip16 is equal to the constant current I0, and further the drain current Ip17 of the MOS transistor MP17 forming a current mirror circuit together with this MOS transistor MP16 becomes equal to the constant current I0.

The MOS transistor MN17 forms a current mirror circuit together with the MOS transistor MN15, so that the drain current In17 is equal to the drain current Ip15 of the MOS transistor MN15, namely shows zero.

Herein the MOS transistor MP17 is serially connected to the MOS transistor MN17, but also the drain current In17 from the MOS transistor MN17 becomes almost zero, in order that the constant current I0 flows as the drain current Ip17 into the MOS transistor MP17 it is necessary to flow a current Ic1' into the phase-compensating capacitor C1 connected to the drain of the MOS transistor MP17. Namely, the phase-compensating capacitor C1 is driven by the current Ic1 equal to the constant current I0.

Thus, as both the phase-compensating capacitors C1 and C2 are driven by the constant current I0, there occurs no difference between a time constant for the phase-compensating capacitor C1 and that for the phase-compensating capacitor C2, which makes it possible to prevent generation of the cut-off state of the MOS transistor MP11 due to completion of charging of the phase-compensating capacitor C1 prior to the charging of the phase-compensating capacitor C2. Namely, it is possible to prevent the generation of an undershoot in which the output voltage VOUT lower than the input voltage VIN is outputted according to the drain current In11 from the MOS transistor MN11 due to the cut-off state of the MOS transistor Next, an ordinary state is considered in which charging to or discharging from the load capacitance Co is not executed, namely for a case the relation between the output VOUT and input voltage VIN is VIN=VOUT. In this case, like in the conventional type of operational amplifier, there is no input nor output to and from the output terminal OUT, and the relation between a drain current in the MOS transistor MP11 and that in the MOS transistor MN11 is Ip11=In11. Therefore, a voltage inputted from the signal source 19 to the differential amplifier circuit 15 is accurately amplified by one time, and is outputted to the output terminal OUT.

With the embodiment describe above, the MOS transistor MP11 forming a compensatory circuit for the output circuit 14 is driven by the level shift circuit 12 so that a current charged into or discharged from the phase-compensating capacitor C1 will become equal to the constant current I0, and also the MOS transistor MN11 is driven by the current correcting circuit 13 so that a current charged into or discharged from the phase-compensating capacitor C2 will become equal to the constant current I0 and in turn equal to a current charged into or discharged from the phase-compensating capacitor C1, so that there occurs no difference between a time required for flowing a charged or discharged current for the phase-compensating capacitor C1 and that for the phase-compensating capacitor C1, namely between a time constant for the phase-compensating capacitor C1 and that for the phase-compensating capacitor C2, and it is possible to prevent the generation of an overshoot or an undershoot in the output terminal OUT in association with input of a step signal into the input terminal IN+. Therefore, it is possible to provide an operational amplifier functioning as a voltage follower, especially in a case where a gain is set to 1.

Further, the level shift circuit 12 and current correcting circuit 13 are driven by a current mirror circuit which supply a constant current based on the drain currents flowing in the MOS transistors MN14 and MN15 forming a differential transistor pair in the differential amplifier circuit 15, so that it is possible to supply a stable current and potential to the MOS transistors MP11 and MN11 in the output circuit 14. Further, the current correcting circuit 13 corrects with its current mirror circuit configuration a current for driving the phase-compensating capacitor C2 so that the driving current will become equal to the current for the level shift circuit 12 to driven the phase-compensating capacitor C1, so that a time constant for the phase-compensating capacitor C1 can accurately be matched to that for the phase-compensating capacitor C2.

As described above, with the invention, the current control unit controls a current for a first output signal outputted from the differential amplifier, and the current correcting unit corrects a current for a second output signal outputted from the differential amplifier so that the value of the current is equal to the value of the current for the first output signal controlled by the current control unit, thereby there is provided the advantage that it is possible to obtain an operational amplifier which can prevent the generation of an overshoot or an undershoot.

With the invention, in the output circuit, the first MOS transistor deciding an output voltage level of the operational amplifier is controlled by using the level shift circuit, the second MOS transistor complementarily acting for the first MOS transistor is controlled by using the current correcting circuit, and at the same time the current correcting circuit corrects a current for driving the second phase-compensating capacitor so that a current charged into or discharged from the second phase-compensating capacitor connected to the second MOS transistor is equal to a current charged into or discharged from the first phase-compensating capacitor connected to the first MOS transistor, therefore, when the first and second phase-compensating capacitors are charged or discharged, no difference appears in the time required for charging or discharging the two capacitors and time constants for the two capacitors are equalized, and even in a transitional state where a step signal indicating quick first transition or last transition is inputted as an input signal, the state where only the first or second MOS transistor is offset never occurs; whereby there is provided the advantage that it is possible to obtain an operational amplifier in which generation of an overshot or an undershot due to the state where only the first or second MOS transistor is offset can be prevented.

With the invention, as an active load connected to a differential transistor pair constituting the differential amplifier circuit, the fifth MOS transistor and sixth MOS transistor are connected in series to the third MOS transistor and fourth MOS transistors respectively, so that a constant current corresponding to an input signal inputted into the differential transistor pair can be supplied to an external MOS transistor forming a current mirror circuit together with the fifth or sixth MOS transistor, and also stable drive with this stable constant current can be realized for an external circuit for the level shift circuit or for the current correcting circuit; whereby there is provided the advantage that it is possible to obtain an operational amplifier in which it is possible to prevent the generation of an overshoot or an undershoot in output from the operational amplifier without fail.

With the invention, the level shift circuit has a current mirror circuit, and the ninth MOS transistor and the tenth MOS transistor are serially connected to the seventh MOS transistor and the eighth MOS transistors forming this current mirror circuit respectively, and at the same time, the ninth MOS transistor forms a current mirror circuit together with the fifth MOS transistor as an active load for the differential amplifier circuit, and the tenth MOS transistor forms a current mirror circuit together with the sixth MOS transistor as an active load for the differential amplifier circuit, so that it is possible to control a voltage level at a connection point between the eighth MOS transistor and the tenth MOS transistor in response to drain currents flowing in the fifth MOS transistor and the sixth MOS transistor forming the differential transistor pair in the differential amplifier circuit. Namely, there is provided the advantage that it is possible to obtain an operational amplifier, in which, with the drain currents flowing in the fifth and the sixth MOS transistor, not only the first MOS transistor connected to a node between the eighth and the tenth MOS transistor can be driven, but also a current charged into or discharged from the first phase-compensating capacitor can be stabilized.

With the invention, the current correcting circuit comprises three current mirror circuits, and the fifteenth MOS transistor serially connected to the eleventh MOS transistor and the sixteenth MOS transistor serially connected to the thirteenth MOS transistor among the MOS transistors forming the current mirror circuits, and at the same time the fifteenth MOS transistor form a current mirror circuit together with the fifth MOS transistor as an active load to the differential amplifier circuit, while the sixteenth MOS transistor forms a current mirror circuit together with the sixth MOS transistor as an active load for the differential amplifier circuit, so that it is possible to control a voltage level at a node between the twelfth MOS transistor and the eighteenth MOS transistor according to the drain currents flowing in the fifth MOS transistor and the sixth MOS transistor forming a differential transistor pair in the differential amplifier circuit. Namely, not only the second MOS transistor connected to a node between the twelfth and the eighteenth MOS transistor can be driven, but also a current charged into or discharged from the second phase-compensating capacitor can be maintained constant. Especially, this constant charged or discharged current can be equalized to a charged or discharged current in the first phase-compensating capacitor similarly decided by the drain currents flowing in the fifth MOS transistor and the sixth MOS transistor by making use of the current mirror circuit; whereby there is provided the advantage that it is possible to obtain an operational amplifier, in which it is possible to prevent the generation of an overshoot or an undershoot in the output from the operational amplifier without fail.

This application is based on Japanese patent application No. HEI 10-321807 filed in the Japanese Patent Office on Nov. 12, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An operational amplifier comprising:
 a differential amplifier circuit which executes differential amplification to a first input signal and a second input signal and outputs a first output signal and a second output signal;

an output circuit consisting of a first MOS transistor and a second MOS transistor each constituting a complimentary circuit, a first phase-compensating capacitor for executing phase compensation in said first MOS transistor, and a second phase-compensating capacitor for executing phase compensation in said second MOS transistor, said output circuit amplifies and outputs a output signal from said differential amplifier circuit;

a level shift circuit which supplies a potential level corresponding to the first output signal of said differential amplifier circuit to the gate of said first MOS transistor and controls a current charged into or discharged from said first phase-compensating capacitor; and a current correcting circuit which corrects a potential level corresponding to the second output signal from said differential amplifier circuit to the gate of said second MOS transistor and corrects a current charged into or discharged from said second phase-compensating capacitor so that the current is equal to a current charged into or discharged from said first phase-compensating capacitor.

2. An operational amplifier according to the claim 1, wherein said differential amplifier circuit comprises:

a third MOS transistor and a fourth MOS transistor forming a differential transistor pair;

a fifth MOS transistor serially connected to said third MOS transistor with the gate and the drain connected to each other and outputs the first output signal using said drain as an output terminal; and a sixth MOS transistor serially connected to said fourth MOS transistor with the gate and the drain connected to each other therein and outputs the second output signal using said drain as an output terminal;

wherein the first input signal is inputted into the gate of said third MOS transistor and the second input signal is inputted into the gate of said fourth MOS transistor.

3. An operational amplifier according to the claim 2, wherein said level shift circuit comprises:

a seventh MOS transistor and an eighth MOS transistor forming a current mirror circuit;

a ninth MOS transistor serially connected to said seventh MOS transistor and forms a current mirror circuit together with said fifth MOS transistor; and a tenth MOS transistor serially connected to said eighth MOS transistor and forms a current mirror circuit together with said sixth MOS transistor;

wherein a node of said eighth MOS transistor and said tenth MOS transistors is connected to the gate of said first MOS transistor.

4. An operational amplifier according to the claim 2, wherein said current correcting circuit comprises:

an eleventh MOS transistor and a twelfth MOS transistor forming a current mirror current;

a thirteenth MOS transistor and a fourteenth MOS transistor forming a current mirror circuit;

a fifteenth MOS transistor serially connected to said eleventh MOS transistor and forms a current mirror circuit together with said fifth MOS transistor;

a sixteenth MOS transistor serially connected to said thirteenth MOS transistor and forms a current mirror circuit together with said sixth MOS transistor;

a seventeenth MOS transistor serially connected to said fourteenth MOS transistor; and an eighteenth MOS transistor serially connected to said twelfth MOS transistor;

wherein said seventeenth MOS transistor and said eighteenth MOS transistor form a current mirror circuit; and a node of said twelfth MOS transistor and said eighteenth MOS transistor is connected to the gate of said second MOS transistor.

5. An operational amplifier according to the claim 3, wherein said current correcting circuit comprises:

an eleventh MOS transistor and a twelfth MOS transistor forming a current mirror current;

a thirteenth MOS transistor and a fourteenth MOS transistor forming a current mirror circuit;

a fifteenth MOS transistor serially connected to said eleventh MOS transistor and forms a current mirror circuit together with said fifth MOS transistor;

a sixteenth MOS transistor serially connected to said thirteenth MOS transistor and forms a current mirror circuit together with said sixth MOS transistor;

a seventeenth MOS transistor serially connected to said fourteenth MOS transistor; and an eighteenth MOS transistor serially connected to said twelfth MOS transistor;

wherein said seventeenth MOS transistor and said eighteenth MOS transistor form a current mirror circuit; and a node of said twelfth MOS transistor and said eighteenth MOS transistor is connected to the gate of said second MOS transistor.

* * * * *